United States Patent
Kishida et al.

[11] Patent Number: 6,118,665
[45] Date of Patent: Sep. 12, 2000

[54] FLEXIBLE PRINTED CIRCUIT AND CONNECTED PRINTED CIRCUIT STRUCTURE

[75] Inventors: Katsuhiko Kishida; Katsunori Tanaka; Toshiya Onodera; Hirofumi Miyamoto, all of Kawasaki, Japan

[73] Assignee: Fujitsu Limited, Kawasaki, Japan

[21] Appl. No.: 09/040,735

[22] Filed: Mar. 18, 1998

[30] Foreign Application Priority Data

Mar. 19, 1997 [JP] Japan .................................. 9-066795

[51] Int. Cl.⁷ ...................................................... H05K 1/11
[52] U.S. Cl. .......................... 361/749; 361/748; 361/750; 361/751; 361/776; 361/681; 361/682; 174/254; 174/256; 174/117 F; 228/180.5
[58] Field of Search ..................................... 361/749, 748, 361/750, 751, 772, 776, 784, 792, 793, 681, 682, 683; 174/250, 254, 255, 256, 117 F; 228/180.5

[56] References Cited

U.S. PATENT DOCUMENTS

| | | | |
|---|---|---|---|
| 4,740,657 | 4/1988 | Tsukogoshi et al. | 174/88 |
| 5,047,895 | 9/1991 | Sasaki | 361/749 |
| 5,183,969 | 2/1993 | Odashima | 174/88 |
| 5,266,746 | 11/1993 | Nishihara et al. | 174/254 |
| 5,309,316 | 5/1994 | Yagi et al. | 361/749 |
| 5,418,691 | 5/1995 | Tokura | 361/803 |
| 5,615,088 | 3/1997 | Mizumo | 361/749 |

*Primary Examiner*—Leo P. Picard
*Assistant Examiner*—David Foster
*Attorney, Agent, or Firm*—Greer, Burns & Crain, Ltd.

[57] ABSTRACT

A flexible printed circuit having wiring patterns printed on a flexible resin film, comprising a narrow flexible area having first wiring patterns and constituting a flexible wiring part and a broad connection area adapted to be adhered to a main board and having second wiring patterns connected to the first wiring patterns and adapted to be electrically connected to wiring patterns on the main board. The second wiring patterns serve to electrically connect the first wiring patterns of the flexible wiring part to the wiring patterns on the main board. Also included is a conductive adhesion surface formed on the broad connection area along a side of the main board, having a width larger than a width of the first wiring patterns, and extending from an inside of a region to an outside thereof. The region is defined in the broad connection area by extending a boundary of the flexible area into the broad connection area. A flexible printed circuit can be provided which has a high peel-off resistance to an applied stress.

32 Claims, 6 Drawing Sheets

FLEXIBLE PRINTED CIRCUIT AND CONNECTED PRINTED CIRCUIT STRUCTURE

This application is based on Japanese patent application No. 9-66795, filed on Mar. 19, 1997, the entire contents of which are incorporated herein by reference.

BACKGROUND OF THE INVENTION a) Field of the Invention

The present invention relates to a printed circuit, and more particularly to a printed circuit structure using a flexible printed circuit.

b) Description of the Related Art

A flexible printed circuit (FPC) is made of a flexible film of resin such as polyimide on which a circuit pattern of copper foil or the like is formed, and is characterized in its flexibility. In this specification, a "flexible printed circuit (FPC)" is intended to include a tape carrier package. Also, the term "flexible printed circuit" should include both a relatively thin sheet-shaped printed circuit and a relatively thick board-shaped printed circuit. The flexible printed circuit may also be called a "flexible printed circuit cable (FPCC)".

In electronic apparatuses having movable units, such as printers, a flexible printed circuit is used as a wiring member for electrically connecting a movable unit and a fixed unit. Even in electronic apparatuses not having movable units, such as liquid crystal displays (LCD) and cameras, a flexible printed circuit is used in order to mount a wiring member in a narrow space. Flexible printed circuits are used in both applications on the assumption that they are bent.

A flexible printed circuit is electrically and mechanically connected to an object unit (hereinafter called a main board) by solder, anisotropic conductive film (ACF) or the like. The main board is a hard board made of glass as in LCD, epoxy, glass epoxy or the like, and is hardly deformed. As a flexible printed circuit is bent or subjected to vibrations or temperature change, a stress is generated which is concentratedly applied to a connection portion between the flexible printed circuit and main board. If the connection strength at the connection portion is insufficient, the flexible printed circuit is peeled off in some cases, from the main board by the applied stress. In order to increase the connection strength, after a flexible printed circuit is connected to a main board, UV curing agent or other curing agents have been coated on the surfaces of the main board and flexible printed circuit. Even with such countermeasure, the connection strength is still not sufficient in some cases. Moreover, this countermeasure increases the number of manufacture processes and raises production cost.

As described above, a flexible printed circuit once connected to a main board may be peeled off by applied stress.

SUMMARY OF THE INVENTION

It is an object of the present invention to provide a flexible printed circuit having a high resistance to peel-off caused by applied stress.

It is another object of the present invention to provide a connected printed circuit structure in which a connected flexible printed circuit is not likely to be peeled off by applied stress.

According to one aspect of the present invention, there is provided a flexible printed circuit having wiring patterns printed on a flexible resin film, comprising: a narrow flexible area having first wiring patterns and constituting a flexible wiring part; a broad connection area adapted to be adhered to a main board and having second wiring patterns connected to the first wiring patterns and adapted to be electrically connected to wiring patterns on the main board, the second wiring patterns serving to electrically connect the first wiring patterns of the flexible wiring part to the wiring patterns on the main board; and a conductive adhesion surface formed on the broad connection area along a side of the main board, having a width larger than a width of the first wiring patterns, and extending from an inside of a region to an outside thereof, the region being defined in the broad connection area by extending a boundary of the flexible area into the broad connection area.

According to another aspect of the present invention, there is provided a flexible printed circuit having wiring patterns printed on a flexible resin film, comprising: a flexible area having first wiring patterns and constituting a flexible wiring part; a connection area adapted to be adhered to a main board and having second wiring patterns connected to the first wiring patterns and adapted to be electrically connected to wiring patterns on the main board, the second wiring patterns serving to electrically connect the first wiring patterns of the flexible wiring Wart to the wiring patterns on the main board; and an adhesion surface formed on the connection area and having an outside boundary with a convex curvature of radius projecting from an inner region to a peripheral region of the connection area at at least one corner of the connection area on a side of the flexible area.

According to a further aspect of the present invention, there is provided a flexible printed circuit having wiring patterns printed on a flexible resin film, comprising: a flexible area having first wiring patterns and constituting a flexible wiring part; and a connection area adapted to be adhered to a main board and having second wiring patterns connected to the first wiring patterns and adapted to be electrically connected to wiring patterns on the main board, the second wiring patterns serving to electrically connect the first wiring patterns of the flexible wiring part to the wiring patterns on the main board, wherein at least a portion of an outer edge of the connection area is formed in a bending shape.

According to a still further aspect of the present invention, there is provided a connected print circuit structure including a printed circuit having a connection area and a flexible printed circuit having a connection area adhered to the connection area of the main substrate, wherein at least one of outer edges of the connection areas has a bending shape.

A flexible printed circuit is most likely to be peeled off when a stress is applied obliquely to the connection area.

If the connection area is made broader than the flexible area and the conductive adhesion surface extending from an inside of the extended region of the flexible area to the outside thereof is used, a stress applied obliquely can be dispersed and a peel-off becomes difficult.

If the adhesion surface having an outside boundary of a convex curvature of radius from an inner region to a peripheral region at a corner of the connection area on the side of the flexible area, is used, a stress applied obliquely can be received not by a point but by a line. Therefore, a stress can be dispersed and a peel-off of the flexible printed circuit becomes hard.

It has been found that the peel-off resistance of a flexible printed circuit adhered to a main board by an adhesive layer is influenced by the peripheral length of an adhered portion rather than an area of the adhered portion. By elongating the peripheral length of an adhered portion, a peel-off resistance can be increased.

As above, a resistance to peel-off of a flexible printed circuit connected to a main board can be increased.

DETAILED DESCRIPTION OF THE PREFERRED EMBODIMENTS

Prior to describing embodiments of the invention, a flexible printed circuit made by prior art will be explained.

Figure 7:
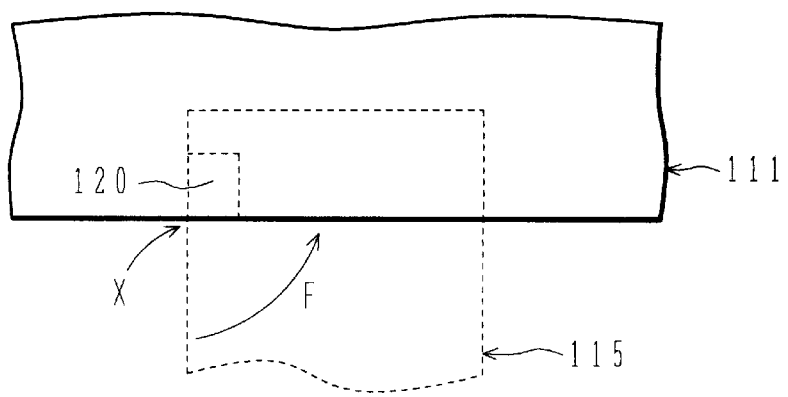
FIG. 7 is a schematic plan view illustrating prior art.

As shown in FIG. 7, a connection portion of a flexible printed circuit 115 is connected to a connection portion of a main board 111. It is assumed herein that the flexible printed circuit 115 is connected to the main board 111 in an area 120 in the connection portions by solder, anisotropic conductive film (ACF) or the like.

If a stress is applied to the flexible printed circuit 115 in the direction raising the lower left side thereof to the upper right, as indicated by an arrow F, this stress is concentratedly applied to a corner point X of the connection area 120. If the connection area 120 starts peeling off near the corner X because of the concentrated stress, the flexible printed circuit 115 peels off easily from the main board 111.

Embodiments of the invention will be described with reference to the accompanying drawings.

Figure 1A:
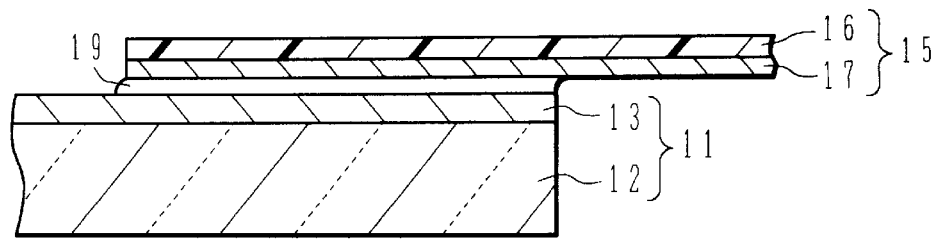
FIGS. 1A to 1C are a cross sectional view and plan views showing a connection structure between a flexible printed circuit and a main board, according to an embodiment of the invention.
Figure 1B:
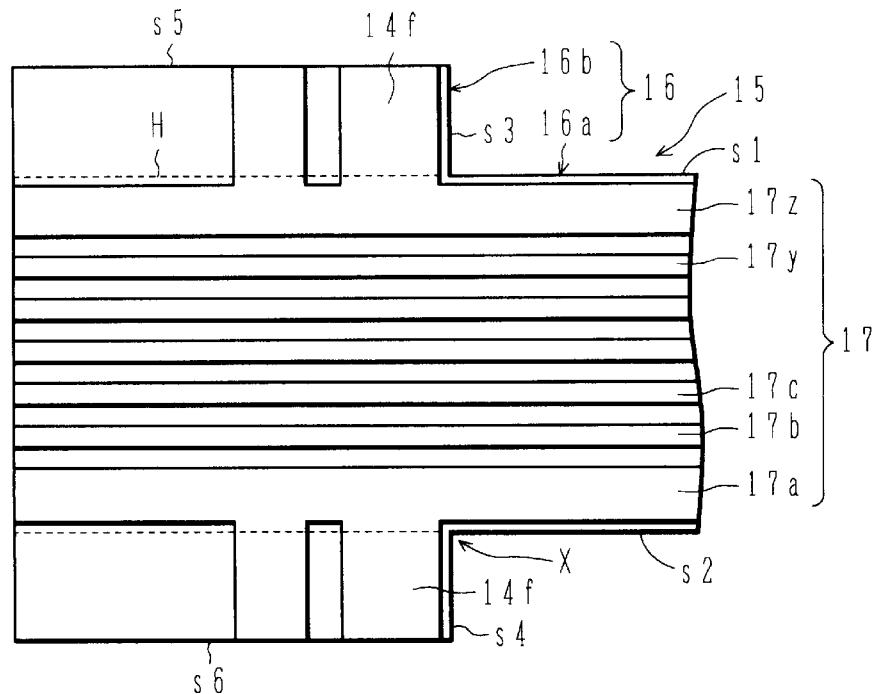
Figure 1C:
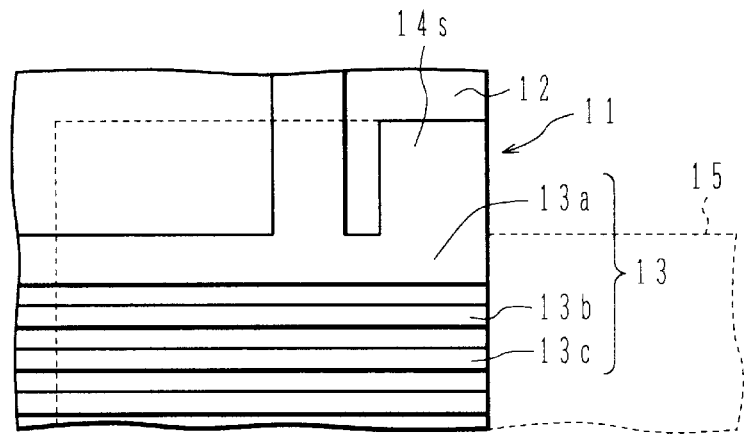

FIGS. 1A to 1C illustrate a connection configuration between a main substrate and a flexible printed circuit according to an embodiment of the invention. FIG. 1A is a cross sectional view of the connection portion, FIG. 1B is a plan view showing the bottom surface of the flexible printed circuit, and FIG. 1C is a plan view showing the top surface of the main board.

As shown in FIG. 1A, the main board 11 has a support substrate 12 on which a wiring pattern 13 is formed. The flexible printed circuit 15 has a resin film 16 on which a wiring pattern 17 is formed. The wiring pattern 13 of the main board is electrically and mechanically connected to the wiring pattern 17 of the flexible printed circuit by a solder layer 19.

The resin film 16 is made of, for example, a polyimide film having a thickness of 10 $\mu$m to 30 $\mu$m, e.g., 12.5 $\mu$m or 25 $\mu$m. The wiring pattern 17 is made of, for example, foil having a minimum pattern width of 0.1 mm to 0.2 mm, a pattern pitch of 0.15 mm to 0.2 mm, and a thickness of 10 $\mu$m to 40 $\mu$m, e.g., 35 $\mu$m.

The support substrate 12 of the main board 11 is a glass substrate for an LCD (not shown), or mainly epoxy or glass epoxy hard substrate for other cases.

As shown in FIG. 1B, wiring patterns 17a to 17z are formed on the bottom surface of the flexible printed circuit 15. The resin film 16 of the flexible printed circuit 15 has a flexible area 16a having a constant width shown in the righthand side of FIG. 1B and a connection area 16b formed wider than the flexible area 16a.

The upper and lower sides s1 and s2 of the flexible area 16a are generally perpendicular to the right sides s3 and s4 of the connection area 16b. Namely, the resin film 16 extends from the narrow area defined by the sides s1 and s2, and via the sides s3 and s4 projecting generally perpendicularly from the sides s1 and s2, to the broad area defined by upper and lower sides s5 and s6 of the broad area. The narrow area constitutes the flexible area 16a and the broad area constitutes the connection area 16b.

The wiring patterns 17a to 17z are disposed with an equal gap on the resin film 16 and extend from the constant width flexible area 16a to the connection area 16b. In this embodiment, the two outermost wiring patterns 17a and 17z among the wiring patterns 17a to 17z are designed to be broader than the other wiring patterns 17b to 17y. All the wiring patterns 17a to 17z may be designed to have the same width. If broad wiring patterns such as power supply lines and narrow wiring patterns such as signal lines are mixedly used, it is preferable to dispose the broad wiring patterns at outermost positions as shown in FIG. 1B.

The connection area 16b of the resin film 16 is made broader than the flexible area 16a. In this broader area, anchor patterns 14f are formed along the right sides s3 and s4 of the resin film, the anchor pattern 14f being made of the same conductive layer as the wiring pattern and broader than the wiring patterns 17a to 17z. Although the anchor patterns 14f are formed on opposite sides of the connection area 16b with respect to the flexible area 16a, either one of them may be formed depending upon the use conditions of the flexible printed circuit.

As shown in FIG. 1C, wiring patterns 13 corresponding to the wiring patterns 17 of the flexible printed circuit are formed on the main board 11. Although the connection area of the main board is only partially shown in FIG. 1C. in the area upon which the connection area of the flexible printed circuit is placed, conductive patterns in mirror symmetry with the conductive patterns of the flexible printed circuit are formed.

In an area along the right side of the main board 11, an anchor pattern 14s made of the same conductive layer as the wiring pattern 13a is formed above the wiring pattern 13a. This anchor pattern 14s is terminated at the inside of the connection area and is not used as a wiring. Also, the anchor pattern 14f of the flexible printed circuit 15 is not used as a wiring. However, the anchor pattern may be used as part of a wiring pattern.

The anchor pattern 14f of the flexible printed circuit is soldered to the anchor pattern 14s of the main board 11.

Consider now that the flexible printed circuit 15 is bent and a stress is applied to the corner X where the flexible area and connection area intersect, as described with prior art. The stress is received by the anchor pattern 14f continuous with the wiring pattern 17a. Since the stress is received by an area above and under the stress applied point X, the flexible printed circuit 15 is not easily peeled off.

In the above description, the resistance to peel-off is increased by the anchor which is not used as a wiring. The peel-off resistance may be increased by an anchor which is also used as a wiring. It is important that the anchor extends along the sides s3 and s4 from the inside of an area H to the outside thereof, thereof, the area H being defined by extending the boundary between the flexible area 16a and the connection area 16b to the left, i.e., by straight lines extending from the upper and lower sides s1 and s2 of the flexible area 16a, in the connection area where the flexible printed circuit and main board are soldered together.

Figure 2A:
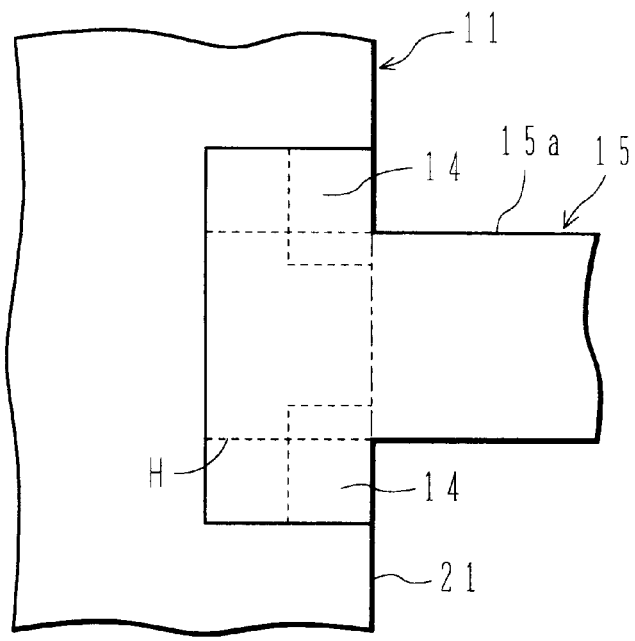
FIGS. 2A to 2C are schematic plan views showing modifications of the embodiment shown in FIGS. 1A to 1C.
Figure 2B:
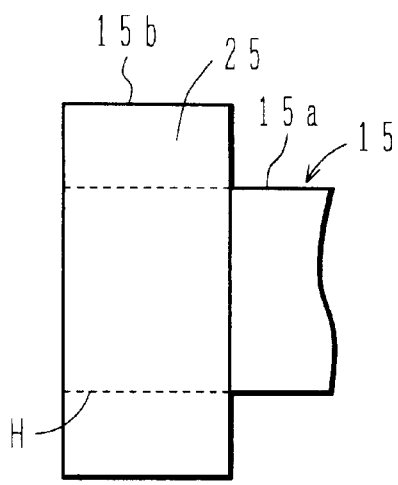
Figure 2C:
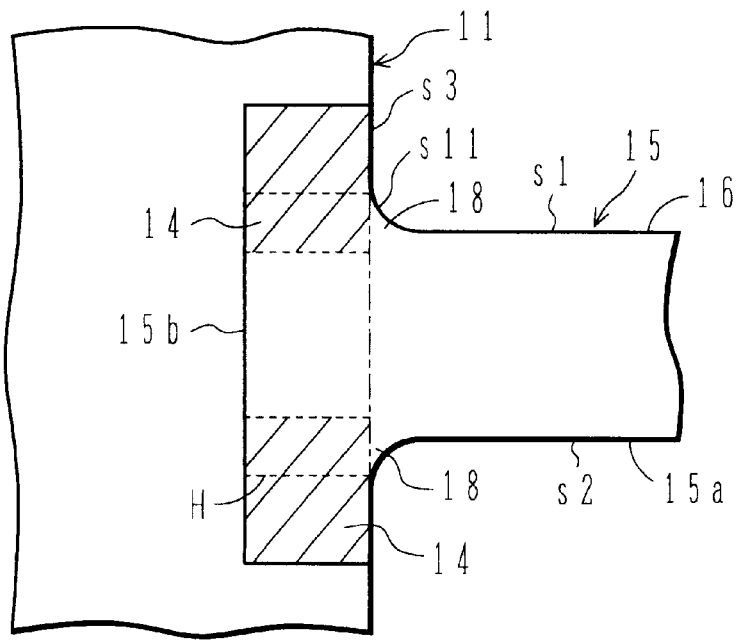

FIGS. 2A to 2C show modifications of the first embodiment shown in FIGS. 1A to 1C.

In a modification shown in FIG. 2A, an anchor pattern 14 extends from the inside of an area H (defined by extending or moving the connection boundary of the flexible area 15a to the left) to the outside thereof in the area where the main substrate 11 and flexible printed circuit 15 are connected. This anchor pattern 14 is not used as a wiring and is a dummy pattern physically and electrically isolated from wiring patterns. The other points are similar to the first embodiment shown in FIGS. 1A to 1C.

FIG. 2B shows the structure of a flexible printed circuit. An anisotropic conductive film 25 is laminated on the whole surface of a connection area 15b of the flexible printed circuit 15. Therefore, the whole surface becomes an adhesion surface as the anisotropic conductive film 25 is pressed against and attached to a main board. The connection area 15b with a width broader than that of the flexible area 15a therefore provides the adhesion surface which extends from the inside of an area H (defined by the extension of the flexible area 15a to the left) to the outside thereof.

FIG. 2C shows an example of a shape of a resin film of a flexible printed circuit. The resin film 16 has an expanded side s11 gradually changing its direction, from the straight side s1 of the flexible area to the side S3 along the edge of the connection area of the main board 11. This expanded side s11 forms a coupling area 18 coupling the flexible area 15a and connection area 15b. As compared to the structure that the sides s1 and s3 intersect at a right angle, the flexible printed circuit 15 is hard to cut because of the presence of the expanded side s11. Similar to the embodiment shown in FIGS. 1A to 1C, an anchor pattern 14 extends from the inside of an area H (defined by moving or extending the connection boundary of the flexible area 15a and the connection area 15b along the direction of the straight part of the flexible area 15a) to the outside thereof.

As shown in FIG. 2C, the layout of the anchor pattern 14 extending from the inside of the area (defined by imaginary straight lines extending from the upper and lower sides s1 and s2) to the outside thereof, is preferable from the viewpoint of increasing the peel-off resistance.

Figure 3A:
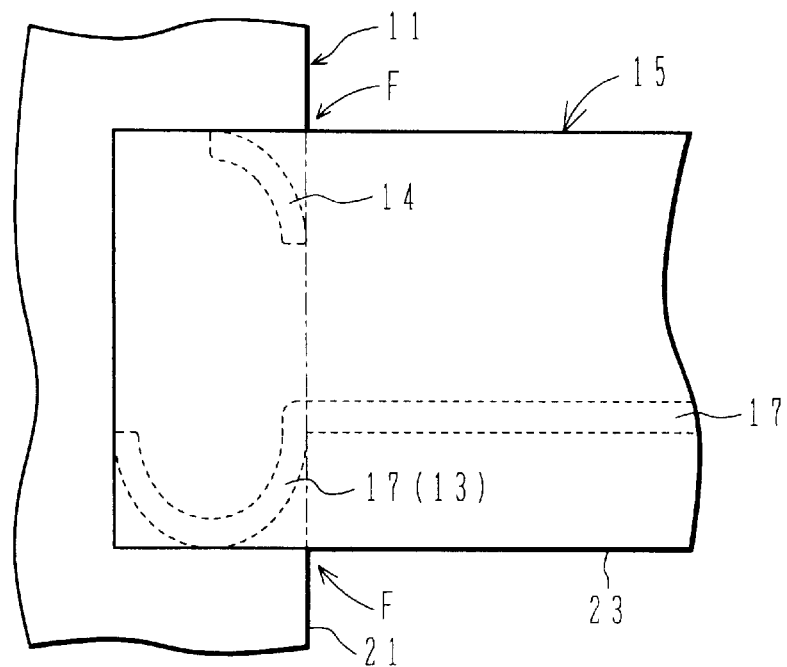
FIGS. 3A and 3B are plan views showing a connection structure between a flexible printed circuit and a main board, according to other embodiments of the invention.
Figure 3B:
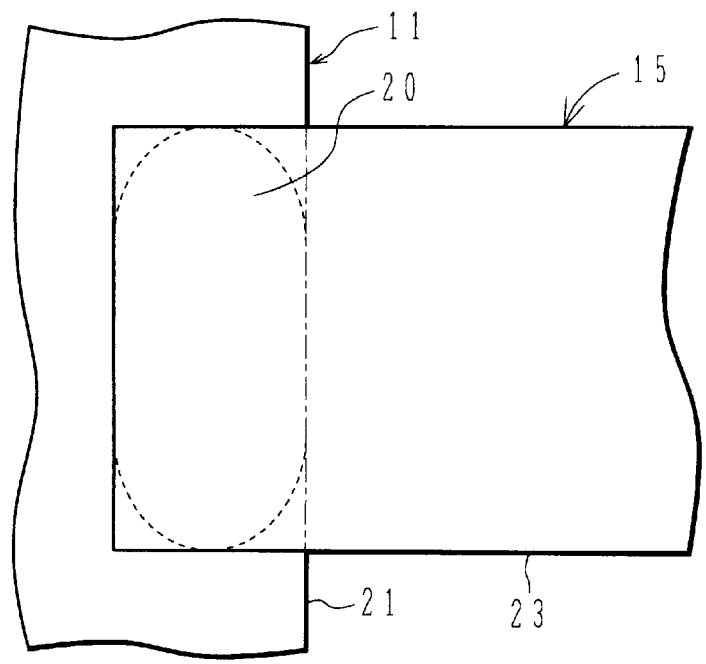

FIGS. 3A and 3B show examples of the structures of flexible printed circuit according to other embodiments.

In the example shown in FIG. 3A. a flexible printed circuit 15 has a stripe shape with a constant width both at the connection area and at the flexible area. The outermost wiring pattern 17 is curved outward in the connection area, and extends toward the end of the connection area while gradually changing its direction. A wiring pattern 13 on a main board 11 has a shape corresponding to the wiring pattern 17. The outer side of the wiring pattern 17 has a smooth curve with a convex curvature of radius from the inner area to the outer area of the connection area at a corner on the flexible area side.

Since this wiring pattern 17 has such a curvature of radius, it receives a stress F applied obliquely at a corner point, by a line. As compared to receiving the stress by a point, the peel-off resistance increases. Instead of using the wiring pattern to form an adhesion surface with a curvature of radius, a dummy pattern such as an anchor pattern 14 shown in FIG. 3A may be used to form an adhesion surface with a curvature of radius.

FIG. 3B shows another example which uses an anisotropic conductive film to form an adhesion surface with a curvature of radius. An anisotropic film is a film which presents conductivity dependent upon a direction, for example, conductivity only in a thickness direction. As a pair of conductive patterns is adhered with an anisotropic conductive film being interposed therebetween, overlapped conductive patterns are electrically connected. An anisotropic conductive film 20 is laminated on the connection area of a flexible printed circuit, the film 20 being rounded at each corner of the connection area. This anisotropic film 20 provides adhesion surfaces between the flexible printed circuit 15 and main board 11. Since the adhesion surface has a curved outer side gently changing its direction at each corner, a stress applied to a corner does not concentrate upon a point but is received by a curved outer side of the adhesion surface. Although the anisotropic conductive film 20 has a curved outer side even at the two corners on the main board 11 side, the curved outer side at these two corners may not be formed but two fight-angle corners may be formed instead, because a stress will not be concentrated on this side. The structures shown in FIGS. 1A to 1C or FIGS. 2A to 2C may be combined with the structures shown in FIGS. 3A and 3B.

The anisotropic conductive film provides an adhesion surface not only in the wiring pattern region but also in the insulating region. Electrical and mechanical connections can be formed by pressing the whole surface of the film, so that the manufacture processes can be simplified.

The present inventors have found that the adhesion strength of a flexible printed circuit adhered to a main board by an anisotropic conductive film, depends on a peripheral length of an adhesion surface rather than on the total area of the adhesion surface.

Figure 4A:
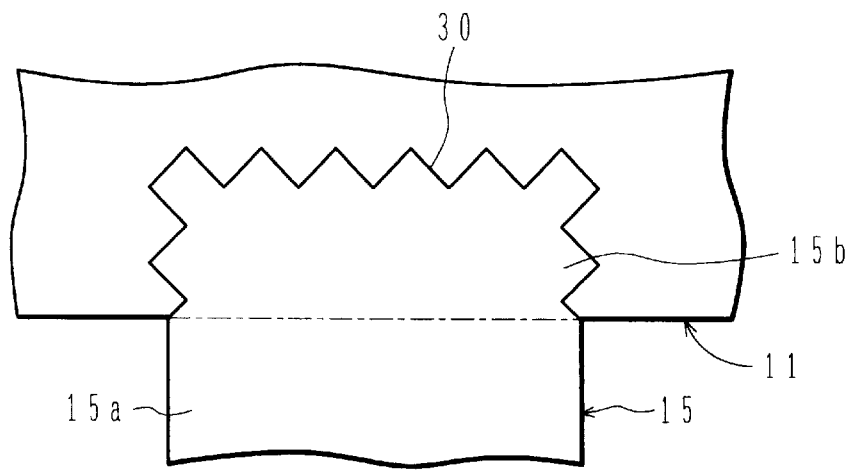
FIGS. 4A to 4C are plan views showing a connection structure between a flexible printed circuit and a main board, according to other embodiments of the invention.
Figure 4B:
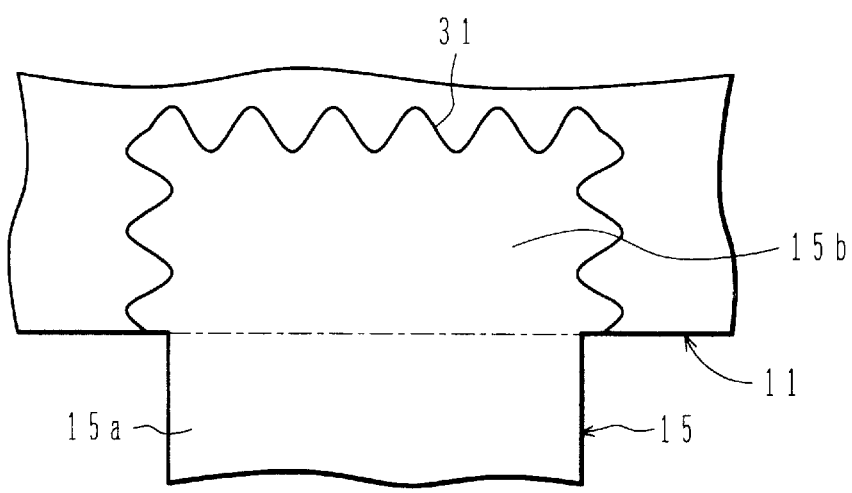
Figure 4C:
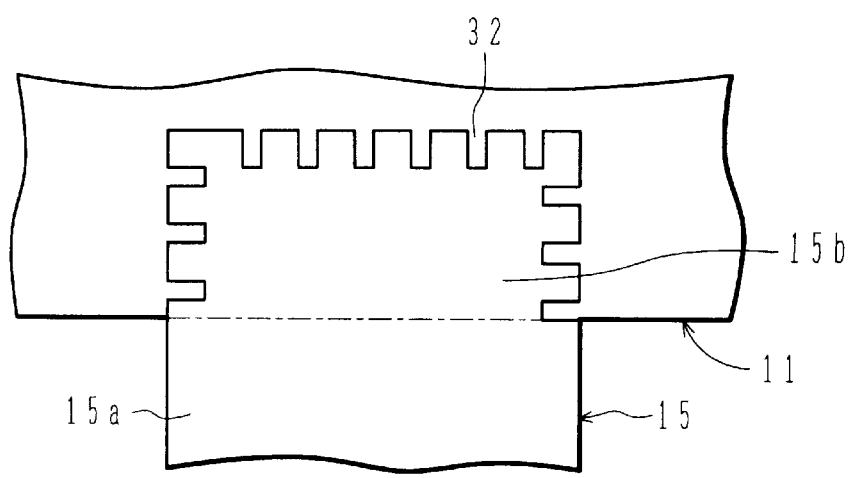

FIGS. 4A to 4C show the structures of flexible printed circuits according to other embodiments of the invention. In each of these structures, it is assumed that the whole of the connection area of the flexible printed circuit is laminated with an anisotropic conductive film.

In the example shown in FIG. 4A, the periphery of the connection area 15b of a flexible printed circuit 15 is formed in a zig-zag shape formed of slanted straight-lines. The peripheral length of a zig-zag shape becomes longer than that of a rectangle having straight-line sides. A shortest distance between two points is represented by a straight line. If two points are interconnected by a zig-zag line, the peripheral length can be elongated as desired.

In the example shown in FIG. 4B, the periphery 31 of the connection area 15b of a flexible printed circuit 15 is formed in a waved shape. For example, the peripheral length of a waved shape formed by a series of semicircular sides is π times as long as the straight-line side.

In the example shown in FIG. 4C. the periphery 32 of the connection area 15b of a flexible printed circuit 15 is formed in a shape having slits formed at the outside area of a rectangular area. By selecting the number of slits and their depths, a peripheral length can be elongated in a broad range.

The flexible printed circuits shown in FIGS. 4A to 4C have the irregular or bending shape at the periphery of the connection area. The peripheral length is elongated at least 10% or more of a regular shape, preferably 20% or more, and more preferably 30% or more. As the peripheral length is elongated, the peel-off resistance can be increased.

Although the whole periphery of the connection area of each flexible printed circuit 15 is made irregular, this irregular pattern may be formed partially at the periphery. In this case, the peripheral length is elongated at the irregular area and hence the peel-off resistance is increased.

FIGS. 5A to 5F illustrate studies made by the present inventors.

Figure 5A:
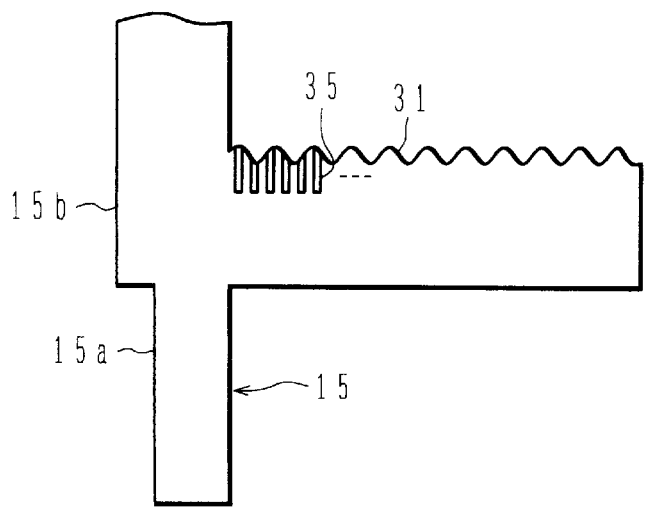
FIGS. 5A to 5F are plan views and cross sectional views illustrating experiments and studies made by the present inventors.

FIG. 5A shows a waved pattern 31 such as shown in FIG. 4B formed at the connection area 15b of a flexible printed circuit 15. The waved pattern 31 is partially formed at one side of the connection area. For example, holes of 2 mm diameter are formed with a drill at an interval of 2 mm so that a waved pattern having a pitch of 2 mm and a wave amplitude of about 1 mm can be formed. In an area continuous with the waved pattern 31, wiring patterns as well as dummy wring patterns 35 may be formed. In this example, the irregular pattern is formed at the side remote from the flexible area. Instead, the irregular pattern may be formed at any side of the connection area.

A high polymer connector film available from Sony Chemicals (Tokyo, Japan) was used as the anisotropic conductive film. This high polymer connector film is made of epoxy-containing binder dispersed with conductive particles made of resin particles plated with Ni/Au.

A flexible printed circuit formed with the waved pattern at one side having the amplitude of 1 mm and the pitch of 2 mm and a flexible printed circuit without such a waved pattern were compared through experiments. The peel-off resistance without the waved pattern was 98 g weight, whereas that with the waved pattern was 189 g weight.

Although the area of the connection area is reduced corresponding to an amount of the waved pattern formed, the experiment results show an increased peel-off resistance. This implies the peel-off resistance is influenced by the peripheral length of the connection area more than by the area of the connection area.

Figure 5B:
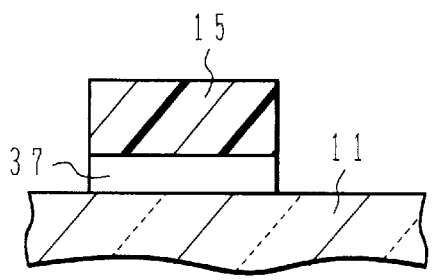
Figure 5C:
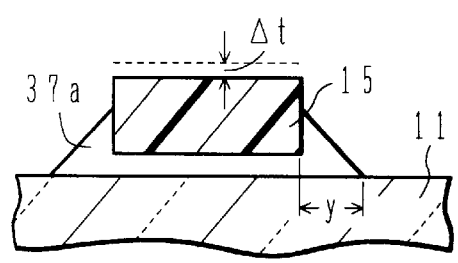

FIGS. 5B and 5C show the cross sectional shapes of a flexible printed circuit and a main board together with an anisotropic conductive film. FIG. 5B shows the cross section before press-adhesion. The flexible printed circuit 15 is placed over the main board 11 via the anisotropic conductive film 37.

FIG. 5C shows the cross section after the flexible printed circuit 15 is pressed toward the main board. It is assumed that this pressure causes the flexible printed circuit 15 to lower by its height Δt. As the flexible printed circuit 15 is lowered, the anisotropic conductive film 37 is extruded partially and extruded portions 37a are formed on both sides of the flexible printed circuit 15. The width of the extruded portion is assumed to be y.

Figure 5D:
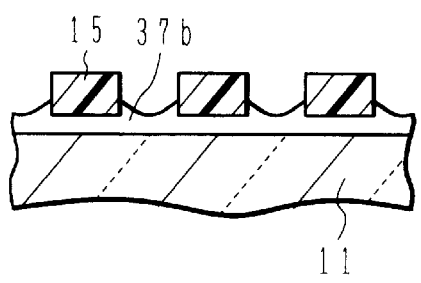
Figure 5E:
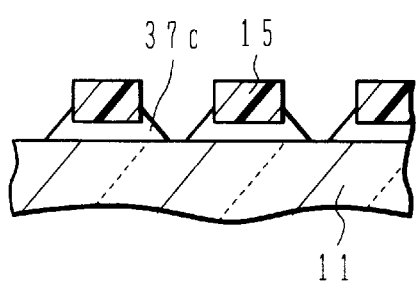

FIGS. 5D and 5E show the cross sectional shapes wherein a side of a flexible printed circuit is formed in a zig-zag shape. FIG. 5D shows portions 37b of an anisotropic conductive film extruded by the flexible printed circuit 15 and became continuous. FIG. 5E shows portions 37c of an anisotropic conductive film extruded by the flexible printed circuit 15 and are still separate.

According to the experiments by the present inventors, if the extruded portions of the anisotropic conductive film become continuous as shown in FIG. 5D, the increase in the adhesion strength is small even if the zig-zag shape is formed at the periphery of the connection area of the flexible printed circuit. On the other hand, the increase in the adhesion strength is significant when the extruded portions of the anisotropic conductive film are still kept separate as shown in FIG. 5E.

In order to maintain the extruded portions separate, it is preferable to make the distance between patterns have a predetermined value or longer when a zig-zag shape is formed at the periphery of the flexible printed circuit.

Assuming that the extruded portion 37a shown in FIG. 5C have an isosceles triangle shape, the cross sectional area of the portion 37a is $y^2/2$.

In order to estimate the extrusion width y, the following simplified model structure is used.

Figure 5F:
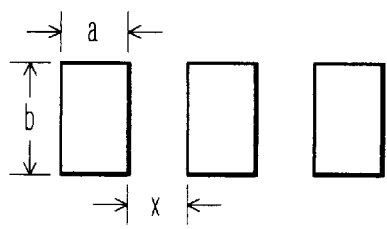

As shown in FIG. 5F, a rectangular pattern having a width a and a length b is periodically disposed at a gap x. As each pattern is lowered by $\Delta t$, the volume of the extruded portion of an anisotropic conductive film is $ab\Delta t$. Assuming that the anisotropic conductive film is extruded from the whole periphery, the peripheral length along which the anisotropic conductive film is extruded is $2(a+b)$.

Assuming that the extrude portion having a cross sectional area of $y^2/2$ is formed along the whole periphery, the volume of the extruded portion is $(a+b)y^2$.

Since the amount of extrusion from under the pattern is equal to the amount of extrusion into the outside of the pattern, an equation $(a+b)y^2 = ab\Delta t$ will hold so that $y=[ab\Delta t/(a+b)]^{1/2}$. Therefore, if $x>2y=2[ab\Delta t/(a+b)]^{1/2}$, the extruded portions of the anisotropic conductive film are maintained separate such as shown in FIG. 5E.

This conclusion is derived from the simplified model, and is not strict but it can be used as a lower limit of the distance between zig-zag patterns to be formed along a side of a flexible printed circuit.

The adjustment of the peripheral shape of the connection area of a flexible printed circuit to be adhered to a main board has been described above in order to increase the adhesion strength. Obviously, the adjustment of the peripheral shape of the main board provides the same effects as the adjustment of the peripheral shape of the flexible printed circuit.

Figure 6A:
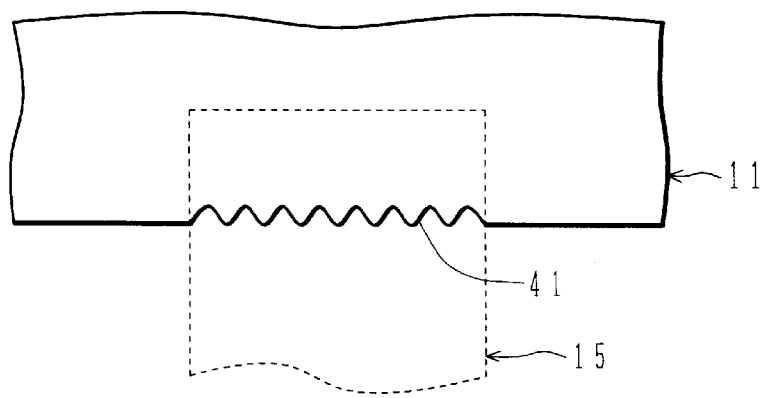
FIGS. 6A and 6B are plan views showing the configurations of main boards according to other embodiments of the invention.
Figure 6B:
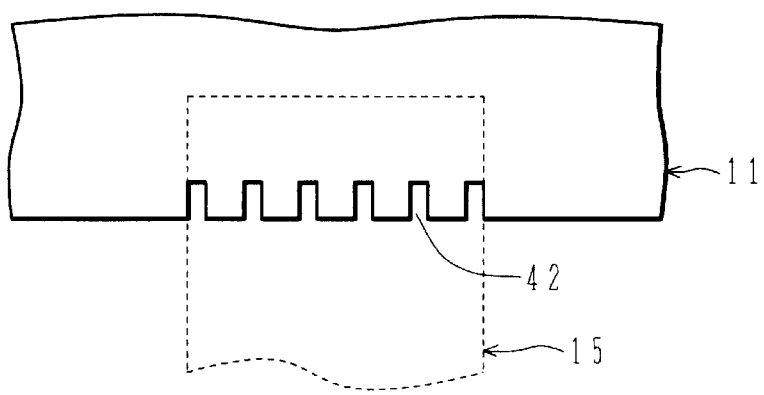

FIGS. 6A and 6B show examples of the adjustment of the peripheral shape of main boards.

In FIG. 6A, the outer edge 41 of a main board 11 in the connection area is formed in a waved zig-zag shape. It is sufficient if this waved shape 41 is formed only at the edge of the main board on the adhesion surface side, and it is not necessary to form it throughout the whole thickness of the main board 11.

In FIG. 6B, the outer edge of the connection area of a main board 11 is formed in a shape with slits 42. Also, it is not necessary to form the slits 42 throughout the whole thickness of the main board 11, but it is sufficient if they are formed only at the edge of the main board on the adhesion surface side.

The present invention has been described in connection with the preferred embodiments. The invention is not limited only to the above embodiments. It is apparent that various modifications, improvements, combinations, and the like can be made by those skilled in the art.

What is claimed is:

1. A flexible printed circuit having wiring patterns printed on a flexible resin film, comprising:

a narrow flexible area having first wiring patterns and constituting a flexible wiring part;

a broad connection area adapted to be adhered to a main board and having second wiring patterns connected to the first wiring patterns and adapted to be electrically connected to wiring patterns on the main board, said second wiring patterns serving to electrically connect the first wiring patterns of the flexible wiring part to the wiring patterns on the main board; and a conductive adhesion surface formed on said broad connection area along a side of the main board, having a width larger than a width of the first wiring patterns, and extending from an inside of a region to an outside thereof, the region being defined in said broad connection area by extending a boundary of said flexible area into said broad connection area, wherein said conductive adhesion surface is an anchor pattern and is not required to establish electric connection between said first wiring patterns to the wiring patterns on the main board.

2. A flexible printed circuit according to claim 1, wherein said conductive adhesion surface is a surface to be soldered.

3. A flexible printed circuit according to claim 1, wherein said narrow flexible area has a width monotonically increasing toward said broad connection area near the boundary of said flexible area with said broad connection area.

4. A flexible printed circuit according to claim 1, wherein the flexible printed circuit has a sheet shape or a board shape.

5. A flexible printed circuit having wiring patterns printed on a flexible resin film, comprising:

a narrow flexible area having first wiring patterns and constituting a flexible wiring part;

a broad connection area adapted to be adhered to a main board and having second wiring patterns connected to the first wiring patterns and adapted to be electrically connected to wiring patterns on the main board, said second wiring patterns serving to electrically connect the first wiring patterns of the flexible wiring part to the wiring patterns on the main board; and an anisotropic conductive film laminated on a whole surface of said broad connection area wherein said whole surface becomes an adhesion surface.

6. A flexible printed circuit according to claim 5, wherein said narrow flexible area has a width monotonically increasing toward said broad connection area near the boundary of said flexible area with said broad connection area.

7. A flexible printed circuit according to claim 5, wherein the flexible printed circuit has a sheet shape or a board shape.

8. A flexible printed circuit having wiring patterns printed on a flexible resin film, comprising:

a flexible area having first wiring patterns and constituting a flexible wiring part;

a connection area adapted to be adhered to a main board and having second wiring patterns connected to the first wiring patterns and adapted to be electrically connected to wiring patterns on the main board, said second wiring patterns serving to electrically connect the first wiring patterns of the flexible wiring part to the wiring patterns on the main board; and an adhesion surface formed on said connection area and having an outside boundary with a convex curvature of radius projecting from an inner region to a peripheral region of the connection area at at least one corner of said connection area on a side of said flexible area such that stress appied to a corner is received by said outside boundary of said adhesion surface.

9. A flexible printed circuit according to claim 8, wherein said adhesion surface is a surface to be soldered.

10. A flexible printed circuit according to claim 8, wherein said adhesion surface is a surface of an anisotropic conductive film laminated on a central area of said connection area.

11. A flexible printed circuit according to claim 8, wherein another adhesion surface is not formed at an outside of the outside boundary having the convex curvature of radius.

12. A flexible printed circuit according to claim 8, wherein the flexible printed circuit has a sheet shape or a board shape.

13. A flexible printed circuit having wiring patterns printed on a flexible resin film, comprising:

a flexible area having first wiring patterns and constituting a flexible wiring part; and a connection area adapted to be adhered to a main board and having second wiring patterns connected to the first wiring patterns and adapted to be electrically connected to wiring patterns on the main board, said second wiring patterns serving to electrically connect the first wiring patterns of the flexible wiring part to the wiring patterns on the main board, wherein at least a portion of an outer edge of said connection area is formed in a bending shape.

14. A flexible printed circuit according to claim 13, further comprising an anisotropic conductive film laminated over a whole surface of said connection area.

15. A flexible printed circuit according to claim 13, wherein the bent shape has a peripheral length longer than 10% or more than a straight line length between two points at opposite ends of the bending shape.

16. A flexible printed circuit according to claim 13, wherein the bending shape has a peripheral length longer than 30% or more than a straight line length between two points at opposite ends of the bending shape.

17. A flexible printed circuit according to claim 13, wherein the bending shape is a waved shape.

18. A flexible printed circuit according to claim 13, wherein the bending shape is a shape with slits formed in an outer area of the bending shape.

19. A flexible printed circuit according to claim 13, wherein the bending shape is a zig-zag shape with straight-line sides.

20. A flexible printed circuit according to claim 13, wherein the flexible printed circuit has a sheet shape or a board shape.

21. A connected printed circuit structure including a main substrate having a printed circuit having a connection area, and a flexible printed circuit having a connection area adhered to the connection area of the main substrate, wherein at least one of outer edges of the connection areas has a bending shape.

22. A connected printed circuit structure according to claim 21, wherein the bending shape has a peripheral length longer than 10% or more than a straight line length between two points at opposite ends of the bending shape.

23. A connected printed circuit structure according to claim 21, wherein the connection areas are adhered by an anisotropic conductive film.

24. A connected printed circuit structure according to claim 21, wherein said flexible printed circuit has a sheet shape or a board shape.

25. An interconnection structure for a liquid crystal display, comprising:

a substrate for the liquid crystal display; and a flexible printed circuit connected to a main board of said liquid crystal display panel, wherein:

said flexible printed circuit having wiring patterns printed on a flexible resin film, comprises:

a narrow flexible area having first wiring patterns and constituting a flexible wiring part;

a broad connection area adapted to be adhered to a main board and having second wiring patterns connected to the first wiring patterns and adapted to be electrically connected to wiring patterns on the main board, said second wiring patterns serving to electrically connect the first wiring patterns of the flexible wiring part to the wiring patterns on the main board; and a conductive adhesion surface formed on said broad connection area along a side of the main board, having a width larger than a width of the first wiring patterns, and extending from an inside of a region to an outside thereof, the region being defined in said broad connection area by extending a boundary of said flexible area into said broad connection area.

26. An interconnection structure for a liquid crystal display according to claim 25, wherein said flexible printed circuit has a sheet shape or a board shape.

27. An interconnection structure for a liquid crystal display, comprising:

a substrate; and a flexible printed circuit connected to the substrate, wherein;

said flexible printed circuit having wiring patterns printed on a flexible resin film, comprises:

a narrow flexible area having first wiring patterns and constituting a flexible wiring part;

a broad connection area adapted to be adhered to a main board and having second wiring patterns connected to the first wiring patterns and adapted to be electrically connected to wiring patterns on the main board, said second wiring patterns serving to electrically connect the first wiring patterns of the flexible wiring part to the wiring patterns on the main board; and an anisotropic conductive film laminated on a whole surface of said broad connection area.

28. An interconnection structure for a liquid crystal display according to claim 26, wherein said flexible printed circuit has a sheet shape or a board shape.

29. An interconnection structure for a liquid crystal display, comprising:

a substrate; and a flexible printed circuit connected to the substrate, wherein;

said flexible printed circuit having wiring patterns printed on a flexible resin film, comprises:

a flexible area having first wiring patterns and constituting a flexible wiring part;

a connection area adapted to be adhered to a main board and having second wiring patterns connected to the first wiring patterns and adapted to be electrically connected to wiring patterns on the main board, said second wiring patterns serving to electrically connect the first wiring patterns of the flexible wiring part to the wiring patterns on the main board; and an adhesion surface formed on said connection area and having an outside boundary with a convex curvature of radius projecting from an inner region to a peripheral region of the connection area at at least one corner of said connection area on a side of said flexible area.

30. An interconnection structure for liquid crystal display according to claim 29, wherein said flexible printed circuit has a sheet shape or a board shape.

31. An interconnection structure for a liquid crystal display, comprising:

a substrate; and a flexible printed circuit connected to the substrate, wherein;

said flexible printed circuit having wiring patterns printed on a flexible resin film, comprises:

a flexible area having first wiring patterns and constituting a flexible wiring part; and a connection area adapted to be adhered to a main board and having second wiring patterns connected to the first wiring patterns and adapted to be electrically connected to wiring patterns on the main board, said second wiring patterns serving to electrically connect the first wiring patterns of the flexible wiring part to the wiring patterns on the main board, wherein at least a portion of an outer edge of said connection area is formed in a bending shape.

32. An interconnection structure for liquid crystal display according to claim 31, wherein said flexible printed circuit has a sheet shape or a board shape.

* * * * *